(12) United States Patent
Wu et al.

(10) Patent No.: US 12,483,217 B2
(45) Date of Patent: Nov. 25, 2025

(54) VARIABLE GAIN AMPLIFIER WITH SUBTHRESHOLD BIASING

(71) Applicant: Apple Inc., Cupertino, CA (US)

(72) Inventors: Kefei Wu, San Diego, CA (US); Morteza Nick, San Francisco, CA (US); David M Signoff, Santa Clara, CA (US); Preeti S Mulage, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 734 days.

(21) Appl. No.: 17/843,507

(22) Filed: Jun. 17, 2022

(65) Prior Publication Data

US 2023/0412135 A1    Dec. 21, 2023

(51) Int. Cl.
    *H03G 3/30* (2006.01)
    *H03F 1/02* (2006.01)
    *H03F 3/72* (2006.01)

(52) U.S. Cl.
    CPC ......... *H03G 3/3026* (2013.01); *H03F 1/0277* (2013.01); *H03F 3/72* (2013.01);
    (Continued)

(58) Field of Classification Search
    CPC ........... H03G 3/3026; H03G 2201/103; H03G 3/3036; H03F 3/72; H03F 2200/24;
    (Continued)

(56) References Cited

U.S. PATENT DOCUMENTS

| | | |
|---|---|---|
| 2,554,905 A | 5/1951 | Hawkins et al. |
| 5,526,058 A | 6/1996 | Sano et al. |

(Continued)

FOREIGN PATENT DOCUMENTS

| | | | |
|---|---|---|---|
| CA | 3052176 A1 * | 2/2020 | ............ H01Q 1/288 |
| CN | 102790596 A | 11/2012 | |

(Continued)

OTHER PUBLICATIONS

Extended European Search Report for European Patent Application No. 23175553.9 dated Nov. 10, 2023; 11 pgs.

(Continued)

*Primary Examiner* — Andrea Lindgren Baltzell
*Assistant Examiner* — Lance Torbjorn Bartol
(74) *Attorney, Agent, or Firm* — FLETCHER YODER PC

(57) ABSTRACT

This disclosure is directed to reducing output voltage distortions of Variable Gain Amplifiers (VGAs). A VGA may include a number of amplifiers each providing a portion of a total gain of the VGA. For example, a processing circuit may select one or more of the amplifiers of the VGA to provide the output signal with a selected gain. However, the selected amplifiers may provide amplified signals with one or more distortion signals when receiving a bias voltage. Systems and methods are described to reduce or cancel the distortion signals of the selected amplifiers by providing a subthreshold nonzero bias voltage (e.g., a weak voltage) to the remaining (e.g., non-selected) amplifiers of the VGA. For example, the non-selected amplifiers may receive the weak voltage to provide distortion signals with similar voltage amplitude and out of phase compared to the distortion signals of the selected amplifiers.

20 Claims, 5 Drawing Sheets

(52) U.S. Cl.
CPC ....... *H03G 3/3036* (2013.01); *H03F 2200/24* (2013.01); *H03F 2200/451* (2013.01); *H03F 2203/45246* (2013.01); *H03F 2203/7206* (2013.01); *H03G 2201/103* (2013.01)

(58) Field of Classification Search
CPC ............. H03F 1/0277; H03F 2200/294; H03F 2200/451; H03F 3/195; H03F 3/245; H03F 3/45475; H03F 2200/511; H03F 1/3211; H03F 2203/45246; H03F 2203/7206; H03F 3/211
USPC ........................................................ 330/254
See application file for complete search history.

(56) References Cited

U.S. PATENT DOCUMENTS

| | | | |
|---|---|---|---|
| 6,714,075 | B2 | 3/2004 | Morie et al. |
| 6,734,730 | B2 | 5/2004 | Doi et al. |
| 6,842,071 | B1 | 1/2005 | Retz et al. |
| 7,231,152 | B2 | 6/2007 | Kim et al. |
| 7,504,885 | B2 | 3/2009 | Oba et al. |
| 7,557,657 | B2 | 7/2009 | Quoc et al. |
| 7,567,126 | B2 | 7/2009 | Arai |
| 8,965,317 | B2 | 2/2015 | Alavi et al. |
| 9,369,103 | B2 | 6/2016 | Morishita et al. |
| 2002/0113650 | A1* | 8/2002 | Kim ..................... H03D 7/1458 330/254 |
| 2008/0186100 | A1* | 8/2008 | Okanobu ............ H03F 3/45659 330/285 |
| 2009/0174481 | A1* | 7/2009 | Chang ...................... H03F 3/72 330/296 |
| 2018/0091136 | A1* | 3/2018 | Wang ................... H10D 86/201 |
| 2021/0050829 | A1* | 2/2021 | Chakraborty ......... H03F 1/3211 |

FOREIGN PATENT DOCUMENTS

| | | | | |
|---|---|---|---|---|
| EP | 2302851 | A1 * | 3/2011 | .......... H03F 1/0244 |
| WO | 2009009652 | A2 | 1/2009 | |
| WO | WO-2009079491 | A1 * | 6/2009 | .......... H03F 1/3205 |
| WO | WO-2009100387 | A1 * | 8/2009 | .......... H03F 1/3205 |

OTHER PUBLICATIONS

S. Jeong et al., "Always-On 12-nW Acoustic Sensing and Object Recognition Microsystem for Unattended Ground Sensor Nodes," in IEEE Journal of Solid-State Circuits, vol. 53, No. 1, pp. 261-274, Jan. 2018, doi: 10.1109/ISSC.2017.2728787.

* cited by examiner

VARIABLE GAIN AMPLIFIER WITH SUBTHRESHOLD BIASING

BACKGROUND

The present disclosure relates generally to wireless communication, and more specifically to signal distortions of transmission signals, reception signals, or both, in variable gain amplifiers of wireless communication devices.

In an electronic device, such as a wireless communication device, a variable gain amplifier may amplify a voltage of input signals. The variable gain amplifier may include a number of selectable amplifiers to amplify the input signal with a gain factor. For example, a transceiver of a radio frequency front-end circuit may include one or more variable gain amplifiers to amplify a voltage of received signals, amplify a voltage of transmission signals, or both. In different cases, the variable gain amplifier may apply a different gain factor to the input signals based on a different selection of the selectable amplifiers. However, the selected amplifiers, in operation, may generate one or more distortion signals when the variable gain amplifier provides an amplified output signal.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a variable gain amplifier circuit is described. The variable gain amplifier may include an input terminal, an output terminal, a biasing circuit that provides a bias voltage equal to or above a bias voltage threshold, and a subthreshold biasing circuit that provides a subthreshold nonzero bias voltage below the bias voltage threshold. The variable gain amplifier may also include a first amplifier having a first input coupled to the input terminal, a second input that couples to the biasing circuit, and a first output coupled to the output terminal. The variable gain amplifier may further include a second amplifier having a third input coupled to the input terminal, a fourth input that couples to the subthreshold biasing circuit, and a second output coupled to the output terminal.

In another embodiment, an electronic device is described. The electronic device may include one or more antennas and a variable gain amplifier coupled to the one or more antennas. The variable gain amplifier may include a first amplifier having a first input that receives a bias voltage equal to or greater than a bias voltage threshold to provide an amplified signal with one or more distortion signals. The variable gain amplifier may also include a second amplifier having a second input that receives a subthreshold nonzero bias voltage below the bias voltage threshold to provide a first distortion cancelling signal.

In yet another embodiment, a method is described. The method includes receiving an indication to amplify a signal with a gain by a processor communicatively coupled to a variable gain amplifier circuit. The method includes determining one or more amplifiers of the variable gain amplifier circuit to provide the signal with the gain by the processor. Moreover, the method includes causing a biasing circuit to provide a bias voltage equal to or higher than a bias voltage threshold to the one or more amplifiers to amplify the signal with the gain by the processor. The method further includes causing a subthreshold biasing circuit to provide a subthreshold nonzero bias voltage below the bias voltage threshold to one or more amplifiers of remaining amplifiers of the variable gain amplifier to provide a distortion cancelling signal to cancel at least a portion of distortions of the amplified signal by the processor. Furthermore, the method includes causing the variable gain amplifier to output a combination of the signal and the distortion cancelling signal by the processor.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
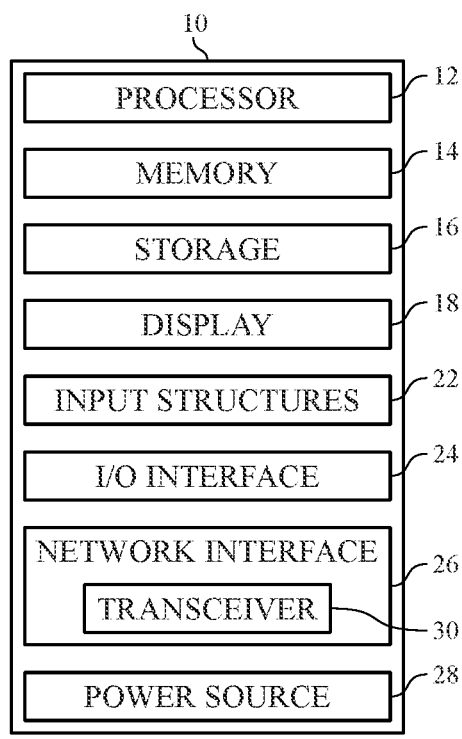
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

This disclosure is directed to signal distortion compensation in variable gain amplifiers (VGAs). A VGA may include a number of selectable amplifiers to amplify input signals. The selectable amplifiers may each have a gain (e.g., a gain factor). Moreover, the gain of selected amplifiers of the VGA may have an additive effect. For example, the VGA may combine amplified output signals of the selected amplifiers to provide a VGA output signal with a total gain. Accordingly, the total gain of the VGA may include a combined gain of the selected amplifiers.

Radio frequency (RF) circuitry of a wireless communication device (e.g., a smartphone) may include one or more RF transceivers having one or more VGAs. The RF circuitry may also include one or more antennas to receive and transmit signals (e.g., RF signals). In some cases, a processing circuitry of the wireless communication device may activate or select (e.g., provide instructions to select) one or more selectable amplifiers of a VGA to amplify transmission signals or reception signals with a total gain.

The wireless communication device may include a biasing circuit and a subthreshold biasing circuit electrically coupled to the one or more VGAs. The biasing circuit may provide a bias voltage to the activated or selected amplifiers of the VGA. The bias voltage may be higher than a voltage threshold of the selectable amplifiers (e.g., an ON voltage threshold). For example, each of the activated or selected amplifiers may amplify the input signals with a respective gain to provide an amplified output signal when receiving the biasing voltage. Accordingly, the VGA of the RF circuitry may provide the amplified transmission signal (e.g., the VGA output signal) to the one or more antennas for transmission and/or provide the amplified received signal (e.g., the VGA output signal) to one or more downstream components (e.g., the processing circuitry) for processing.

In some cases, in operation, one or more of the activated amplifiers of the VGA may generate one or more distortion signals when the VGA provides an amplified output signal. For example, a nonlinear signal transfer function of one or more elements of an activated amplifier (e.g., one or more transistors) may generate the distortion signals. If not compensated for, the distortion signals of the selected amplifiers may cause deviation and/or non-linear behavior of the amplified output signal and/or the VGA output signal. Moreover, the distortion signals may disturb one or more operations of the downstream components (e.g., the processing circuitry).

With the foregoing in mind, the activated amplifiers of the VGA may generate the distortion signals within a voltage magnitude range when receiving the bias voltage. Moreover, different activated amplifiers having different gains may provide distortion signals within the voltage magnitude range. The disclosed embodiments supply a nonzero subthreshold bias voltage (e.g., below 0.1 microvolt (µV), below 0.5 µV, below 0.1 millivolt (mV), below 0.1 volt (V), and so on) to one or more of remaining deactivated or non-selected amplifiers of the VGA, causing the one or more deactivated amplifiers to also generate distortion signals within the voltage magnitude range, which may at least partially cancel or compensate for the distortion signals generated by the activated amplifiers. In particular, the nonzero subthreshold bias voltage may be below the ON voltage threshold of the selectable amplifiers of the VGA. For example, the one or more elements of the selectable amplifiers may provide the distortion signals when receiving the nonzero subthreshold bias voltage.

The subthreshold bias voltage may be determined during manufacturing or during operation of the wireless communication device after manufacturing. For example, different amplifiers (or combination of amplifiers) of the selectable amplifiers may provide different distortion signals when receiving the bias voltage (or when activated). Each of the activated amplifiers (or combination of the activated amplifiers) may provide different distortion signals with the amplified output signals.

In different cases, an activated amplifier may provide one or more unique distortion signals based on device or component size variations, device or component type variations, configuration variations, and/or assembly process variations, among other things. Accordingly, the subthreshold biasing circuit may provide a different subthreshold bias voltage for generating the distortion cancelling signals when different set of amplifiers of the VGA are activated. In some cases, multiple subthreshold bias voltages may be stored in a non-transitory memory device (e.g., in the form of a lookup table). Accordingly, the subthreshold bias voltage may be selected and/or provided to the non-selected amplifiers based on the activated amplifiers of the VGA.

Compensating for the distortion signals of the activated amplifiers by the remaining deactivated amplifiers of the VGA may cancel or reduce at least some deviations and/or non-linear behavior of the VGA output signal. Moreover, compensating for the distortion signals of the activated amplifiers may improve a signal to noise and distortion ratio (SNDR), signal to noise ratio (SNR), a signal distortion ratio (SDR), and/or an Output Third-Order Intercept Point (OIP3) of the VGA. Furthermore, the VGA, and in turn the RF circuitry and the wireless communication device, may use a smaller area (e.g., footprint) to cancel (or reduce) an electrical power of the distortion signals based on using the deactivated amplifiers to cancel (or reduce) the electrical power of the distortion signals of the activated amplifiers.

FIG. 1 is a block diagram of an electronic device 10 (e.g., a wireless communication device, a mobile communication device, a smartphone, and so on), according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 28.

The various functional blocks shown in FIG. 1 may include hardware elements (including circuitry), software elements (including machine-executable instructions) or a combination of both hardware and software elements (which may be referred to as logic). The processor 12, the memory 14, the nonvolatile storage 16, the display 18, the input structures 22, the I/O interface 24, the network interface 26, and/or the power source 28 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices.

It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with the memory 14 and the nonvolatile storage 16 to perform various algorithms. For example, as mentioned above and discussed in more details below, the processor 12 may reference a lookup table stored on the memory 14 and/or the nonvolatile storage 16 to select a nonzero subthreshold bias voltage ($V_{ST}$) among a number of nonzero subthreshold bias voltages ($V_{ST}$). Moreover, in specific cases, the processor 12 may determine and store the nonzero subthreshold bias voltages ($V_{ST}$) based on running one or more tests to determine distortion signals generated by one or more selectable amplifiers of a VGA. Alternatively or additionally, the nonzero subthreshold bias voltages ($V_{ST}$) may be predetermined (e.g., during manufacturing) and stored in the memory 14 and/or the nonvolatile storage 16. Such programs or instructions executed by the processor 12 may be stored in any suitable article of manufacture that includes one or more tangible, computer-readable media.

The tangible, computer-readable media may include the memory 14 and/or the nonvolatile storage 16, individually or collectively, to store the instructions, routines, and/or other data (e.g., the lookup table). Moreover, the memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol.

The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FTC)), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network, a satellite network, a non-terrestrial network, and so on.

In particular, the network interface 26 may include, for example, one or more interfaces for using a Release-15 cellular communication standard of the 5G specifications that include the millimeter wave (mmWave) frequency range (e.g., 24.25-30 gigahertz (GHz)) and/or any other cellular communication standard release (e.g., Release-16, Release-17, any future releases) that define and/or enable frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. In some cases, the transceiver 30 may include one or more VGAs. As mentioned above, a VGA of the transceiver may provide amplified transmission signal (e.g., the VGA output signal) to the one or more antennas for transmission and/or provide the amplified received signal (e.g., the VGA output signal) to one or more downstream components, such as the processor 12, for processing. The power source 28 of the electronic device 10 may include any suitable source of power, such as a rechargeable lithium polymer (Li-poly) battery and/or an alternating current (AC) power converter.

Figure 2:
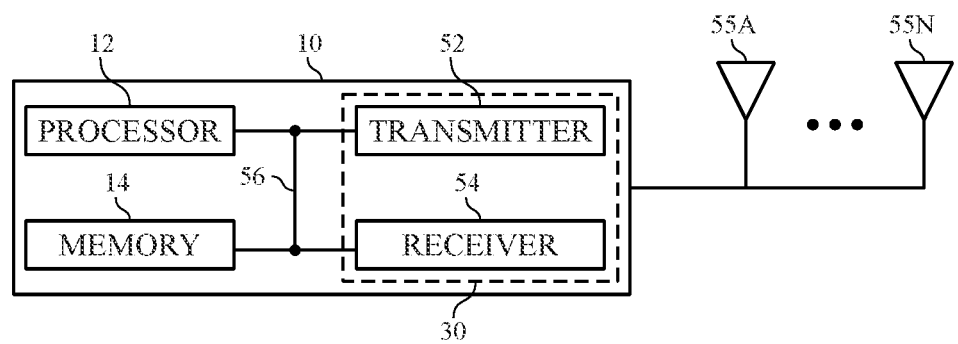
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, and/or a network) to one another to transmit and/or receive data between one another.

The electronic device 10 may include the transmitter 52 and/or the receiver 54 that respectively enable transmission and reception of data between the electronic device 10 and an external device via, for example, a network (e.g., including base stations) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on.

Each antenna 55 may be associated with one or more beams and various configurations. In some embodiments, multiple antennas of the antennas 55A-55N of an antenna group or module may be communicatively coupled a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
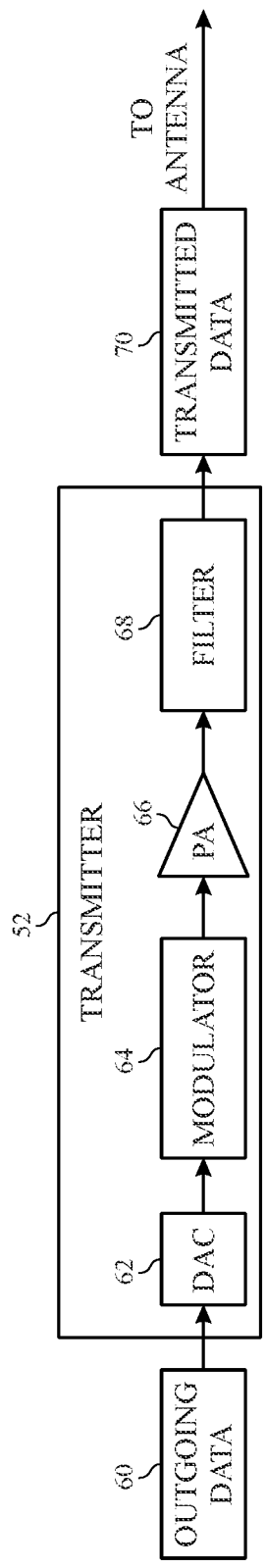
FIG. 3 is a schematic diagram of a transmitter the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing signal 60 in the form of a digital signal to be transmitted via the antenna 55. In some cases, the outgoing signal 60 may include a waveform. For example, the waveform may have a specific oscillation frequency or may include a chirp signal with increasing or decreasing frequency. Moreover, in alternative or additional embodiments, the electronic device 10 may use alternative or additional types of waveform such as pulse waveform, stepped-frequency continuous wave (SFCW), orthogonal frequency division multiplexing symbols (OFDM), ultra-wideband (UWB), signals of opportunity (e.g., WiFi), and/or other waveforms.

A digital-to-analog converter (DAC) 62 of the transmitter 52 may convert the digital signal to an analog signal, and a modulator 64 may combine the converted analog signal with a carrier signal to generate a radio wave. As mentioned above, such radio wave may have a specific oscillation frequency or may be a chirp signal with increasing or decreasing frequency. A power amplifier (PA) 66 may receive the modulated signal from the modulator 64. The power amplifier 66 may amplify the modulated signal to a suitable level to drive transmission of the signal via the antenna 55.

A filter 68 (e.g., filter circuitry and/or software) of the transmitter 52 may then remove undesirable noise from the amplified signal to generate transmitted signal 70 (or transmitted signal) to be transmitted via the antenna 55. The filter 68 may include any suitable filter or filters to remove the undesirable noise from the amplified signal, such as a bandpass filter, a bandstop filter, a low pass filter, a high pass filter, and/or a decimation filter. Additionally, the transmitter 52 may include any suitable additional components not shown, or may not include certain of the illustrated components, such that the transmitter 52 may transmit the outgoing signal 60 via the antenna 55. For example, the transmitter 52 may include a mixer and/or a digital up converter. As another example, the transmitter 52 may not include the filter 68 if the power amplifier 66 outputs the amplified signal in or approximately in a desired frequency range (such that filtering of the amplified signal may be unnecessary).

Moreover, the DAC 62, the modulator 64, the PA 66, the filter 68, and/or other components not shown in FIG. 3 may include a VGA with selectable amplifiers. The processor 12 may provide instructions to provide a bias voltage ($V_T$) to one or more activated or selected amplifiers of the VGA and determine and provide a nonzero subthreshold bias voltage ($V_{ST}$) to remaining deactivated (e.g., non-selected) amplifiers of the VGA. For example, the processor 12 may refer to information stored on the memory 14 (e.g., a lookup table) to determine the nonzero subthreshold bias voltage ($V_{ST}$) to be provided to the non-selected amplifiers based on the selected amplifiers.

Figure 4:
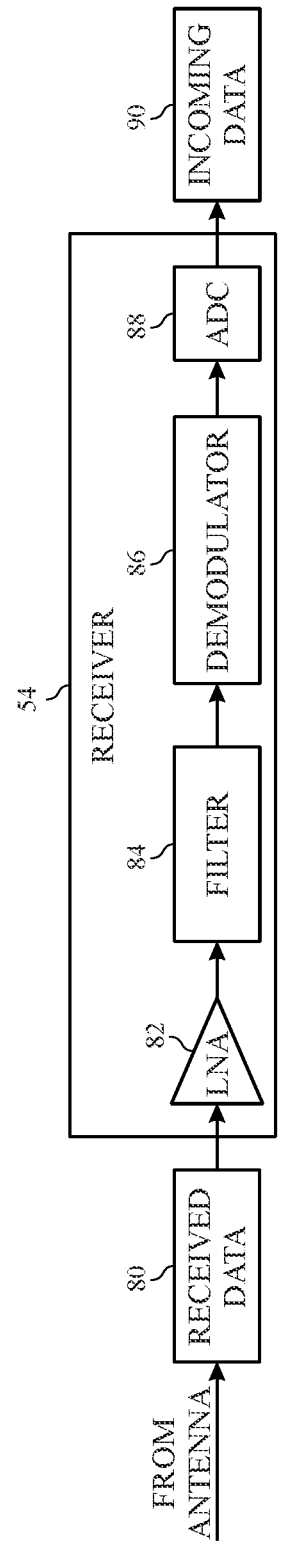
FIG. 4 is a schematic diagram of a receiver of the electronic device of FIG. 1, according to embodiments of the present disclosure.

FIG. 4 is a schematic diagram of the receiver 54 (e.g., receive circuitry), according to embodiments of the present disclosure. As illustrated, the receiver 54 may receive received data from the one or more antennas 55 in the form of a signal 80 (e.g., an analog signal). Low noise amplifier (LNA) 82 may amplify the received signal 80 to a suitable level for the receiver 54 to process. In particular, the LNA 82 may amplify the signal 80 by applying a gain (e.g., a power gain) to the signal 80. For example, the LNA 82 may include one or more VGAs, though the LNA 82 may also include one or more passive components (e.g., transmission lines, routing circuitry, phase shifters, and so on).

As an example, the LNA 82 may include one or more VGAs each including multiple amplifiers (e.g., selectable amplifiers) coupled in parallel using multiple transmission lines. Moreover, each of the selectable amplifiers of the one or more VGAs may apply a respective gain (e.g., a power gain) to the received signal 80 when selected or activated. For example, amplified output signal of each activated amplifier of the VGA may additively combine to generate a VGA output signal. Accordingly, each of the selectable amplifiers of a VGA may provide a portion of a total gain applied by the VGA. In some cases, the VGA may provide a portion of a total gain applied by the LNA 82 and/or the receiver 54.

In any case, the LNA 82 may provide amplified signals to an RF mixer. The RF mixer may include a filter 84 (e.g., filter circuitry and/or software), a demodulator 86, and an analog to digital converter (ADC) 88. In different embodiments, the filter 84 may include filter circuitry, filtering software, or both. The filter 84 may receive the amplified signal from the LNA 82. The filter 84 may remove undesired noise from the received signal, such as cross-channel interference. The filter 84 may also remove additional signals received by the one or more antennas 55 that are at frequencies other than the desired signal. Moreover, the filter 84 may include any suitable filter or filters to remove the undesired noise or signals from the received signal, such as a bandpass filter, a bandstop filter, a low pass filter, a high pass filter, and/or a decimation filter.

The demodulator 86 may remove a radio frequency envelope and/or extract a demodulated signal from the filtered signal for processing. The ADC 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received signal 80 via the one or more antennas 55. For example, the receiver 54 may include a mixer component and/or a digital down converter.

Figure 5:
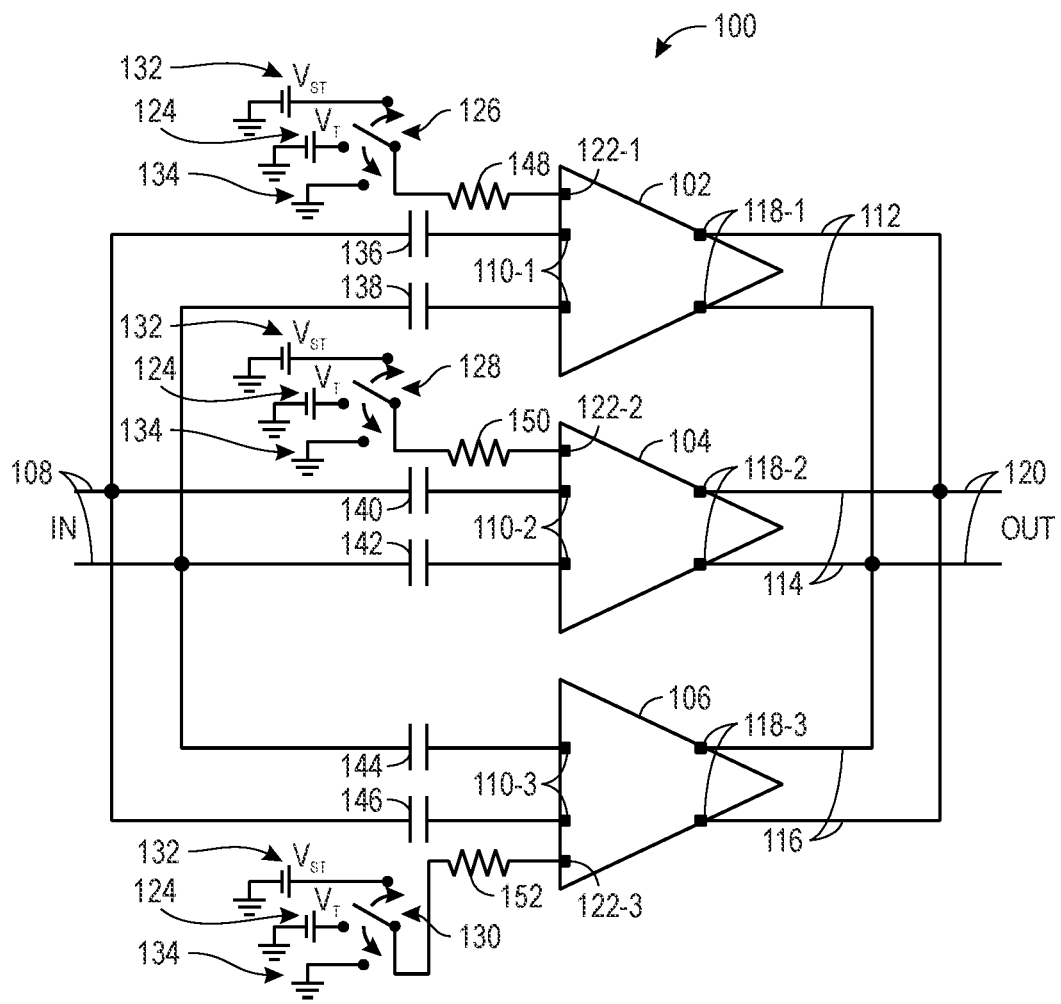
FIG. 5 is a schematic diagram of a variable gain amplifier (VGA) of the electronic device of FIG. 1 including three amplifiers, according to embodiments of the present disclosure.

FIG. 5 is a schematic diagram of a VGA 100 including a first amplifier 102, a second amplifier 104, and a third amplifier 106. Each of the amplifiers 102, 104, and 106 may receive an input signal 108 (e.g., IN) via first amplifier inputs 110-1, 110-2, and 110-3 (e.g., first amplifier input pins) respectively. For example, the input signal 108 may include the outgoing signal 60 shown in FIG. 3, the received signal 80 shown in FIG. 4, or a different signal. Moreover, in the depicted embodiment, the amplifiers 102, 104, and 106 may receive a differential input signal 108 via differential first amplifier inputs 110-1, 110-2, and 110-3. However, in other embodiments, the amplifiers 102, 104, and 106 may receive a single-ended input signal 108 via single-ended first amplifier inputs 110-1, 110-2, and 110-3.

The amplifiers 102, 104, and 106 are selectable to be activated to provide output signals. Each of the amplifiers 102, 104, and 106 may apply a respective gain to the input signal 108 when selected or activated. For example, the first amplifier 102 may amplify the input signal 108 with a first gain (e.g., a gain of 16) to provide a first amplifier output signal 112 via amplifier outputs 118-1 (e.g., amplifier output pins) when selected or activated. Moreover, the second amplifier 104 may amplify the input signal 108 with a second gain (e.g., a gain of 8) to provide a second amplifier output signal 114 via amplifier outputs 118-2 when selected or activated. Furthermore, the third amplifier 106 may amplify the input signal 108 with a third gain (e.g., a gain of 16) to provide a third amplifier output signal 116 via amplifier outputs 118-3 when selected or activated.

The VGA 100 may combine the first amplifier output signal 112, the second amplifier output signal 114, and/or the third amplifier output signal 116 to provide a VGA output signal 120 (e.g., OUT). For example, the VGA output signal 120 may have a total gain based on selecting and/or activating one or more of the amplifiers 102, 104, and 106. In some cases, a processor (e.g., the processor 12 of FIG. 1) may select or activate one or more of the amplifiers 102, 104, and 106 to generate the VGA output signal 120 with a desired total gain. For example, the processor may determine the total gain based on a voltage amplitude of the input signal 108, a desired voltage amplitude of the VGA output signal 120, or both. In specific cases, the processor may determine the desired voltage amplitude of the VGA output signal 120 based on one or more downstream components receiving the VGA output signal 120.

By the way of example, the VGA output signal 120 may have a total gain based on a cumulative value of the first gain and the second gain when the first amplifier 102 and the second amplifier 104 are selected and/or activated. Moreover, the VGA output signal 120 may have a total gain based on a cumulative value of the second gain and the third gain when the second amplifier 104 and the third amplifier 106 are selected and/or activated. Furthermore, the VGA output signal 120 may have a total gain based on a cumulative value of the first gain and the third gain when the first amplifier 102 and the third amplifier 106 are selected and/or activated.

Alternatively, the VGA output signal 120 may have a total gain based on a cumulative value of the first gain, the second gain, and the third gain when the first amplifier 102, the second amplifier 104, and the third amplifier 106 are selected and/or activated. It should be appreciated that the depicted embodiment is by the way of example and in other embodiments the VGA 100 may include a different number of amplifiers (e.g., 2 or more, 4 or more, 5 or more, 8 or more, 10 or more, 12 or more, and so on). In such embodiments, the VGA output signal 120 may similarly have a total gain based on a cumulative value of the selected or activated amplifiers.

With the foregoing in mind, activating each of the amplifiers 102, 104, and 106 may include coupling second amplifier inputs 122-1, 122-2, and 122-3 to a biasing circuit 124. The biasing circuit 124 may provide a bias voltage ($V_T$) higher than an ON voltage threshold of the amplifiers 102, 104, and/or 106. Accordingly, the biasing circuit 124 may provide the bias voltage ($V_T$) to the amplifiers 102, 104, and/or 106 via the second amplifier inputs 122-1, 122-2, and/or 122-3 coupled thereto.

In some cases, the amplifiers 102, 104, and 106 may have a similar ON voltage threshold. In such cases, the biasing circuit 124 may provide one bias voltage ($V_T$) higher than an ON voltage threshold of the amplifiers 102, 104, and 106 to the activated amplifiers 102, 104, and 106 coupled thereto. In other cases, the amplifiers 102, 104, and 106 may have different ON voltage thresholds. In such other cases, the biasing circuit 124 may provide one or multiple different bias voltages ($V_T$) higher than an ON voltage threshold of the respective amplifiers 102, 104, and/or 106 to the activated amplifiers 102, 104, and/or 106 coupled thereto. Accordingly, the activated amplifiers 102, 104, and 106 may provide the first amplifier output signal 112, the second amplifier output signal 114, and/or the third amplifier output signal 116 based on coupling the second amplifier inputs 122-1, 122-2, and 122-3 to the biasing circuit 124.

In some embodiments, the second amplifier inputs 122-1, 122-2, and 122-3 may couple to the biasing circuit 124 via switches 126, 128, and 130. For example, a first state of the switch 126 may couple the second amplifier input 122-1 of the first amplifier 102 to the biasing circuit 124. In some cases, a processor, such as the processor 12 of FIG. 1, may close the switch 126 at the first state to couple the second amplifier input 122-1 of the first amplifier 102 to the biasing circuit 124.

Similarly, a first state of the switch 128 may couple the second amplifier input 122-2 of the second amplifier 104 to the biasing circuit 124. The processor may close the switch 128 at the first state to couple the second amplifier input 122-2 of the second amplifier 104 to the biasing circuit 124. Moreover, a first state of the switch 130 may couple the second amplifier input 122-3 of the third amplifier 106 to the biasing circuit 124. The processor 12 may close the switch 130 at the first state to couple the second amplifier input 122-3 of the third amplifier 106 to the biasing circuit 124.

However, in some cases, each of the amplifier output signals 112, 114, and/or 116 may include an amplified output signal and one or more distortion signals when activated. If not compensated for, the distortion signals may cause deviation and/or non-linear behavior of the amplifier output signals 112, 114, and/or 116. Moreover, the distortion signals may disturb one or more operations of the processor 12, the DAC 62, the modulator 64, the PA 66, the filter 68, the filter 84, the demodulator 86, and/or the ADC 88, among other things.

The amplifiers 102, 104, and 106 may provide the distortion signals within a voltage magnitude range based on receiving the bias voltage ($V_T$). Moreover, the amplifiers 102, 104, and 106 may provide the distortion signals within the same voltage magnitude range when receiving a nonzero subthreshold bias voltage ($V_{ST}$). The nonzero subthreshold bias voltage ($V_{ST}$) may be below the ON voltage threshold of the amplifiers 102, 104, and 106. For example, nonzero subthreshold bias voltage ($V_{ST}$) may be below 0.1 microvolt (μV), below 0.5 μV, below 0.1 millivolt (mV), below 0.1 volt (V), and so on. A subthreshold biasing circuit 132 may provide one or more nonzero subthreshold bias voltages ($V_{ST}$).

In the disclosed embodiments, one or more of the remaining deactivated or non-selected amplifiers 102, 104, and/or 106 may provide controlled distortion signals to cancel the distortion signals of the activated amplifiers 102, 104, and/or 106 when supplied with the nonzero subthreshold bias voltage ($V_{ST}$). For example, the distortion cancelling signals of the deactivated amplifiers 102, 104, and/or 106 supplied with the nonzero subthreshold bias voltage ($V_{ST}$) may be 180 degrees out of phase from the distortion signals of the activated amplifiers 102, 104, and/or 106.

In such cases, the second amplifier inputs 122-1, 122-2, and 122-3 of the deactivated amplifiers 102, 104, and 106 may couple to the subthreshold biasing circuit 132 via the switch 126, 128, or 130. For example, a second state of the switch 126 may couple the second amplifier input 122-1 of the first amplifier 102 to the subthreshold biasing circuit 132. The processor 12 may close the switch 126 at the second state to couple the second amplifier input 122-2 of the second amplifier 104 to the subthreshold biasing circuit 132.

Similarly, a second state of the switch 128 may couple the second amplifier input 122-2 of the second amplifier 104 to the subthreshold biasing circuit 132. The processor 12 close the switch 128 at the second state to couple the second amplifier input 122-2 of the second amplifier 104 to the subthreshold biasing circuit 132. Moreover, a second state of the switch 130 may couple the second amplifier input 122-3 of the third amplifier 106 to the subthreshold biasing circuit 132. The processor 12 may close the switch 130 at the second state to couple the second amplifier input 122-3 of the third amplifier 106 to the subthreshold biasing circuit 132.

In some embodiments, the processor (e.g., the processor 12 of FIG. 1) may determine multiple nonzero subthreshold bias voltages ($V_{ST}$) based on different selections or activations of the amplifiers 102, 104, and/or 106 to provide the VGA output signal 120 with the total gain. In such embodiments, the processor 12 may set a nonzero subthreshold bias voltage ($V_{ST}$) of the multiple nonzero subthreshold bias voltages ($V_{ST}$) based on a selection or activation of the amplifiers 102, 104, and/or 106.

Moreover, the processor 12 may determine a number and/or configuration of the deactivated amplifiers 102, 104, and/or 106 to couple to the subthreshold biasing circuit 132 based on the different activations of the amplifiers 102, 104, and/or 106. For example, the processor 12 couple one or more of the deactivated amplifiers 102, 104, and/or 106 to the subthreshold biasing circuit 132 based on activation of any combination of the amplifiers 102, 104, and/or 106.

In some embodiments, the processor 12 may refer to predetermined information stored in a memory (e.g., the memory 14 and/or nonvolatile storage 16 of FIG. 1) to couple the deactivated amplifiers to the subthreshold biasing circuit 132. For example, the processor 12 may refer to the predetermined information based on the activation of the amplifiers 102, 104, and/or 106. In some cases, the processor 12 may use a lookup table stored in the memory 14 that stores the predetermined information.

The lookup table may be generated during manufacturing and/or may be generated (or updated) by the processor 12 during operation of the electronic device 10. For example, the processor 12 may generate or update the lookup table (e.g., the predetermined information) using machine learning during operation of the electronic device 10. In any case, the processor 12 may refer to the lookup table to provide instructions to the switches 126, 128, and 130 to couple the activated amplifiers to the biasing circuit 124 and couple one or more of the deactivated amplifiers to the subthreshold biasing circuit 132.

Moreover, in some embodiments, the processor 12 may couple the deactivated amplifiers 102, 104, and 106 to a ground connection 134. The deactivated amplifiers 102, 104, and 106 coupled to the ground connection 134 may thus be in an idle state. In some cases, a third state of the switch 126 may couple the second amplifier input 122-1 of the first amplifier 102 to the ground connection 134. The processor 12 may close the switch 126 at the third state to couple the second amplifier input 122-2 of the first amplifier 102 to the ground connection 134.

Similarly, a third state of the switch 128 may couple the second amplifier input 122-2 of the second amplifier 104 to the ground connection 134. The processor 12 may close the switch 128 at the third state to couple the second amplifier input 122-2 of the second amplifier 104 to the ground connection 134. Moreover, a third state of the switch 130 may couple the second amplifier input 122-3 of the third amplifier 106 to the ground connection 134. The processor 12 may close the switch 130 at the third state to couple the second amplifier input 122-3 of the third amplifier 106 to the ground connection 134.

In any case, the processor 12 may activate or deactivate the amplifiers 102, 104, 106 and/or close or open switches 126, 128, 130 based on entries of the lookup table corresponding to activation of any combination of the amplifiers 102, 104, and 106. Accordingly, the activated amplifiers 102, 104, and 106 may amplify the input signal 108 based on the respective gains when coupled to the biasing circuit 124. As mentioned above, the activated amplifiers 102, 104, and 106 may generate the amplifier output signals 112, 114, and 116, which may include the amplified output signal and the distortion signals.

When coupled to the subthreshold biasing circuit 132, the one or more of the deactivated amplifiers 102, 104, and 106 may provide distortion cancelling signals. When coupled to the ground connection 134, the one or more of the deactivated amplifiers 102, 104, and 106 may become idle. Accordingly, the processor 12 may cause the one or more of the deactivated amplifiers 102, 104, and 106 to provide distortion cancelling signals by coupling them to the subthreshold biasing circuit 132, or to become idle by coupling them to the ground connection 134.

In some embodiments, the VGA 100 may also include capacitors 136, 138, 140, 142, 144, and 146. In the depicted embodiment, each differential amplifier inputs 110-1, 110-2, and 110-3 may couple to a respective pair of the capacitors 136, 138, 140, 142, 144, and 146 in series. Each of the capacitors 136, 138, 140, 142, 144, and 146 may block a direct current (DC) to provide alternative current (AC) coupling. For example, the capacitors 136, 138, 140, 142, 144, and 146 may block bias voltages ($V_T$). Accordingly, the capacitors 136, 138, 140, 142, 144, and 146 may provide the input signal 108 in the form of an AC signal when the respective amplifiers 102, 104, and/or 106 are ON or activated.

The VGA 100 may also include resistors 148, 150, and 152. The resistors 148, 150, and 152 may isolate AC signals from the biasing circuit 124, the subthreshold biasing circuit 132, and/or the ground connection 134. In some cases, the resistors 148, 150, and 152 may reduce leakage of the input signal 108 or the amplifier output signals 112, 114, or 116 (e.g., the amplified output signals and/or the distortion signals) from the amplifiers 102, 104, and 106 to the biasing circuit 124, the subthreshold biasing circuit 132, and/or the ground connection 134. In any case, in different embodiments, the VGA 100 may or may not include the capacitors 136, 138, 140, 142, 144, and 146, the resistors 148, 150, and 152.

Figure 6:
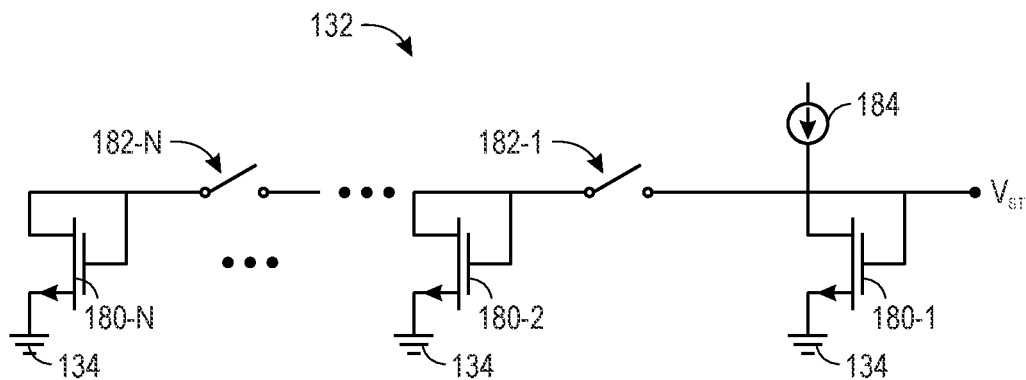
FIG. 6 is a schematic of a subthreshold biasing circuit of the electronic device of FIG. 1 and electrically coupled to the VGA of FIG. 5, according to embodiments of the present disclosure.

With the foregoing in mind, FIG. 6 depicts a subthreshold biasing circuit 132. In some cases, the subthreshold biasing circuit 132 may be allocated or otherwise dedicated to the amplifiers 102, 104, and 106 of the VGA 100. For example, the electronic device 10 and/or the VGA 100 may include the subthreshold biasing circuit 132. The subthreshold biasing circuit 132 may include a number of transistors 180 (e.g., a first transistor 180-1, additional transistors 180-2, 180-N) configured to couple in parallel to provide the nonzero subthreshold bias voltage ($V_{ST}$). Each of the transistors 180 may couple or uncouple a current source 184 to the ground connection 134.

A number of switches 182 (e.g., switch 182-1 and switches 182-2, 182-N) may couple or uncouple one or more of the transistors 180 in parallel. The transistors 180 that are coupled in parallel may couple the current source 184 to the ground connection 134. In some cases, the current source 184 may receive configuration settings based on a configuration of the biasing circuit 124 and/or the amplifiers 102, 104, and/or 106. For example, the current source 184 may be adjusted based on a configuration of the amplifiers 102, 104, and/or 106 to provide electrical current to one or more of the transistors 180. Accordingly, a current output of the current source 184 may be adjusted based on the configuration of the amplifiers 102, 104, and/or 106 and/or predefined settings.

In some cases, a processor (e.g., the processor 12 of FIG. 1) may provide instructions indicative of the configuration of the amplifiers 102, 104, and/or 106 to the current source 184. Moreover, a processor, the current source 184, or any other viable component may provide one or more control signals to open or close the switches 182. Accordingly, the nonzero subthreshold bias voltage ($V_{ST}$) is adjusted based on controlling a current output of the current source 184 and a number of the switches 182 coupled to the current source 184.

The transistors 180 may draw current through the current source 184 to the ground connection 134 when coupled between the current source 184 and the ground connection 134. In the depicted embodiment, a first transistor 180-1 is coupled between the current source 184 and the ground connection 134 without a switch 182. The remaining transistors (e.g., a transistor 180-2, a transistor 180-N) may couple between the current source 184 and the ground connection 134 in parallel to the first transistor 180-1 when a respective switch 182 (e.g., a switch 182-1, or a switch 182-N) is closed. In some cases, each of the transistors 180 may draw a similar current through the current source 184 to the ground connection 134. However, in other cases, the transistors 180 may draw a different current through the current source 184 to the ground connection 134.

A number of the transistors 180 drawing current through the current source 184 to the ground connection 134 may determine the nonzero subthreshold bias voltage ($V_{ST}$). Moreover, a processor (e.g., the processor 12 of FIG. 1), the current source 184, or any other viable component may provide one or more control signals to close a number of the switches 182 to control a current consumption of the subthreshold biasing circuit 132. Accordingly, the processor 12 (or any other viable component providing the control signals) may control the nonzero subthreshold bias voltage ($V_{ST}$) based on closing a number of the switches 182. For example, the configuration settings of the current source 184 is predetermined (e.g., stored in the memory 14 and/or nonvolatile storage 16 of FIG. 1) or is determined based on running one or more tests by the processor 12.

In some embodiments, the subthreshold biasing circuit 132 may provide the nonzero subthreshold bias voltage ($V_{ST}$) to maintain a total current consumption of the VGA 100 below a total current consumption threshold. In such embodiments, the subthreshold biasing circuit 132 may provide the nonzero subthreshold bias voltage ($V_{ST}$) based on a current consumption of the subthreshold biasing circuit 132. For example, the subthreshold biasing circuit 132 may provide the nonzero subthreshold bias voltage ($V_{ST}$) such that a current consumption of the subthreshold biasing circuit 132 and the biasing circuit 124 is below the total current consumption threshold.

For example, the processor 12 may receive or determine the current consumption of the biasing circuit 124 and the subthreshold biasing circuit 132. In some cases, the processor 12 may receive or determine the current consumption of the subthreshold biasing circuit 132 from the current source 184. In alternative or additional cases, the processor 12 may receive or determine the current consumption of the subthreshold biasing circuit 132 based on a current draw of each of the transistors 180 and a number of transistors 180 coupled between the current source 184 and the ground connection 134. Accordingly, the processor 12 may provide the one or more control signals to provide the nonzero subthreshold bias voltage ($V_{ST}$) such that the biasing circuit 124 and the subthreshold biasing circuit 132 may draw a total current below the total current consumption threshold.

With the foregoing in mind, it should be appreciated that the depicted embodiment of the subthreshold biasing circuit 132 in FIG. 6 is provided as an example, and in other embodiments, a different subthreshold biasing circuit 132 may provide the nonzero subthreshold bias voltage. Moreover, in some cases, the biasing circuit 124 may include a similar or different circuit. For example, the biasing circuit 124 may include a current source, a number of transistors coupled (or configured to be coupled) in parallel, one or more switches configured to couple and uncouple the number of parallel transistors, among other things.

Figure 7:
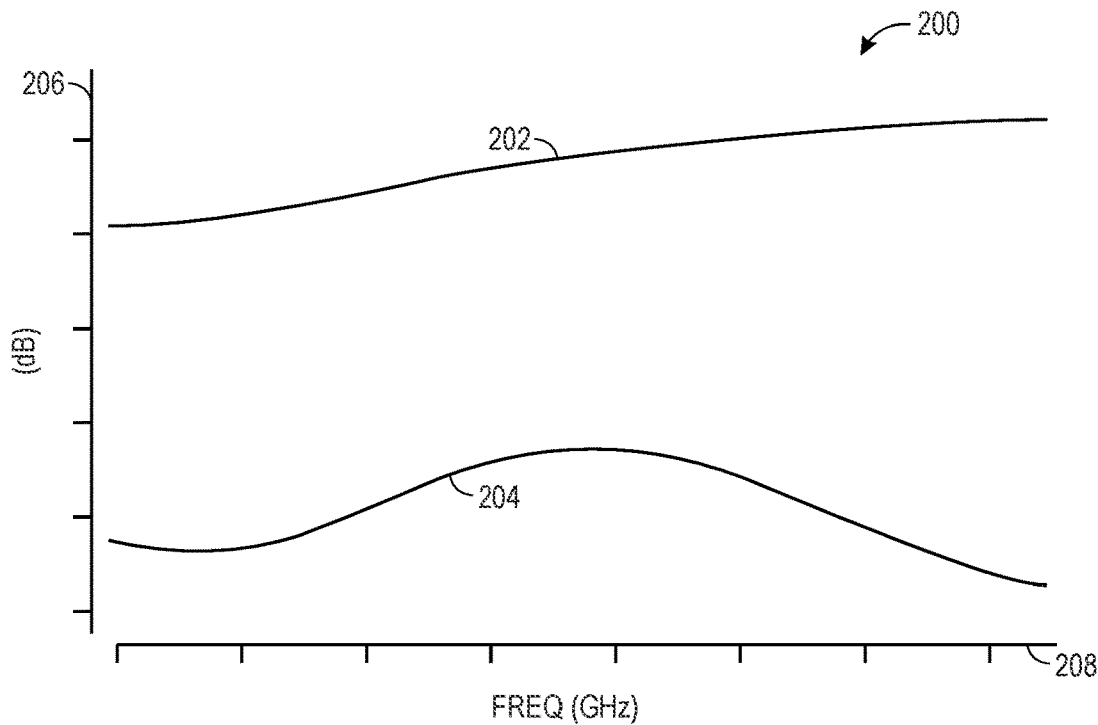
FIG. 7 is a graph of a distortion signal and a compensated distortion signal of an output of the VGA of FIG. 5, according to embodiments of the present disclosure.

FIG. 7 depicts a graph 200 of a distortion signal 202 and a compensated distortion signal 204 of the VGA 100. As discussed above, the amplifier output signals 112, 114, and/or 116 of the activated amplifiers 102, 104, and/or 106 may each generate an amplified output signal and one or more distortion signals. Moreover, the amplifier output signals 112, 114, and/or 116 may combine to form the VGA output signal 120.

Accordingly, the VGA output signal 120 may include the combined amplified output signals and the distortion signal 202 (the combined distortion signals) of the activated amplifiers 102, 104, and 106 receiving the bias voltage ($V_T$). Moreover, the VGA output signal 120 may include the combined amplified output signals and the compensated distortion signal 204 (the combined distortion signals) of the activated amplifiers 102, 104, and/or 106 receiving the bias voltage ($V_T$) and the deactivated amplifiers 102, 104, and/or 106 receiving the nonzero subthreshold bias voltage ($V_{ST}$). As mentioned above, the distortion signals may cause deviation and/or non-linear behavior of the VGA output signal 120 and are undesired.

The subthreshold biasing circuit 132 described above may provide the nonzero subthreshold bias voltage ($V_{ST}$) to one or more of the deactivated amplifiers 102, 104, and 106 shown in FIG. 5 to reduce or mitigate an output power (e.g., electrical power) of the distortion signals 202 to generate the compensated distortion signal 204. Accordingly, the output power of the distortion signals 202 may decrease at various frequencies when the deactivated amplifiers 102, 104, and/or 106 provide the distortion cancelling signals based on receiving the nonzero subthreshold bias voltage ($V_{ST}$), resulting in the compensated distortion signal 204.

For example, the processor 12 may supply the nonzero subthreshold bias voltage ($V_{ST}$) to one or more of the deactivated amplifiers 102, 104, and 106. Moreover, the deactivated amplifiers 102, 104, and 106 may provide the distortion cancelling signals based on receiving the nonzero subthreshold bias voltage ($V_{ST}$). Accordingly, the VGA 100 may generate the VGA output signal 120 that includes the compensated distortion signal 204. As illustrated in FIG. 7, the compensated distortion signal 204 may have a reduced output power (e.g., reduced by 1 decibel (dB), 2 dB, 3 dB, 4 dB, 10 dB, and so on) compared to the distortion signals 202.

A vertical axis 206 of the graph 200 may illustrate an output power of the distortion signal 202 and the compensated distortion signal 204 over an output power range in decibel-milliwatts (dBm). Moreover, the graph 200 may include a horizontal axis 208 depicting a frequency of the distortion signal 202 and the compensated distortion signal 204 over a frequency range in gigahertz (GHz). However, it should be appreciated that the frequency range of the horizontal axis 208 is provided as an example and can be substantially different in other embodiments.

Moreover, the distortion signal 202 and the compensated distortion signal 204 are provided as examples. Accordingly, it should be appreciated that in different embodiments, the distortion signal 202 and the compensated distortion signal 204 may have different output powers over different frequencies. Furthermore, the VGA 100 may provide the VGA output signal 120 with the high gains at a frequency range around a center frequency (e.g., 1 megahertz (MHz), 20 MHz, 200 MHz, 1 GHz, 24 GHz, 27 GHz, 30 GHz, and so on).

In the depicted embodiment, the amplifiers 102, 104, and 106 of the VGA 100 may provide the VGA output signal 120 with the highest output power within a frequency range from 24 GHZ to 30 GHz. Moreover, the distortion signals 202 or the compensated distortion signals 204 may have a low output power within the frequency range from 24 GHZ to 30 GHz. For example, a distortion signal 202 may have an output power of approximately −67 dBm at around 27 GHz, and the compensated distortion signals 204 may have an output power of approximately −78 dBm at around 27 GHz. However, in different embodiments, the VGA output signal 120 may have a highest output power and the distortion signals 202 or the compensated distortion signals 204 may have the lowest output power around a different frequency.

Figure 8:
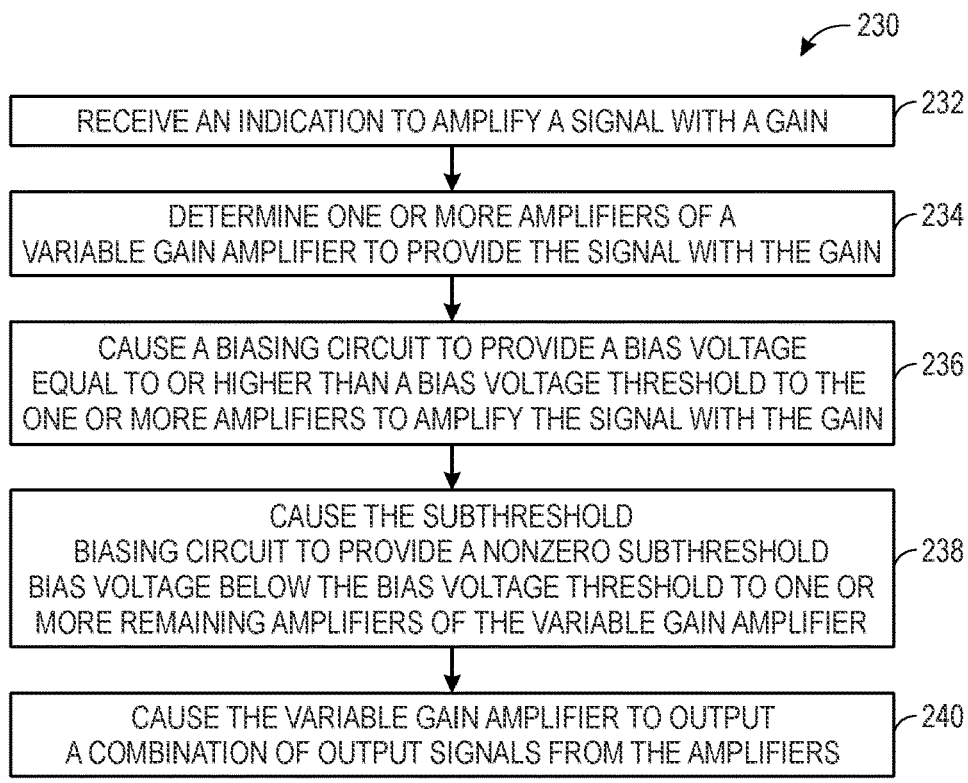
FIG. 8 is a flowchart of a process for generating the output signal of the VGA of FIG. 5 with reduced distortion, according to embodiments of the present disclosure.

FIG. 8 is a flowchart of a method 230 for generating the VGA output signal 120 described with respect to the VGA 100 of FIG. 5 with reduced distortion by providing the compensated distortion signal 204 illustrated in FIG. 7. The method 230 may facilitate compensating for gain distortions of the amplifier output signals 112, 114, and 116 discussed above. Any suitable device that may control components of the electronic device 10 including the VGA 100, such as the processor 12, may perform the method 230.

For example, the processor 12 may perform the method 230 to provide control signals to the switches 126, 128, and 130, the biasing circuit 124, and/or the subthreshold biasing circuit 132. Accordingly, the processor 12 may perform the method 230 to compensate for the gain distortions of the amplifiers 102, 104, and/or 106. In some embodiments, the method 230 may be implemented by executing instructions stored in a tangible, non-transitory, computer-readable medium, such as the memory 14 or nonvolatile storage 16, using the processor 12. For example, the method 230 may be performed at least in part by one or more software components, such as an operating system of the electronic device 10, one or more software applications of the electronic device 10, and the like.

While the method 230 is described using steps in a specific sequence, it should be understood that the present disclosure contemplates that the described steps may be performed in different sequences than the sequence illustrated, and certain described steps may be skipped or not performed altogether. For example, although the method 230 is described with respect to the amplifiers 102, 104, and 106 of the VGA 100 illustrated in FIG. 5, it should be appreciated that in additional or alternative cases, the method 230 may be similarly used for a different combination of amplifiers of a VGA.

In block 232, the processor 12 receives an indication to amplify a signal with a gain. For example, the processor 12 may receive an indication to amplify the received signal 80 of FIG. 4, the outgoing signal 60 of FIG. 3, or a different signal using a VGA (e.g., the VGA 100 of FIG. 1n block 234, the processor 12 determines one or more selectable amplifiers of the VGA to amplify the signal with the received gain. As mentioned above, output signals of the selected amplifiers may have an additive effect when combined. For example, the processor 12 may determine the amplifiers 102, 104, 106, or a combination of the amplifiers 102, 104, and 106 of the VGA 100 to amplify the signal with the received gain.

In block 236, the processor 12 causes a biasing circuit to provide a bias voltage higher than a bias voltage threshold to activate the one or more selected amplifiers to amplify the signal with the gain. For example, the processor 12 may close the switches 126, 128, and/or 130 at the first state of the selected amplifiers 102, 104, and/or 106. As such, the processor 12 may couple the second amplifier inputs 122-1, 122-2, and/or 122-3 of the selected amplifiers 102, 104, and/or 106 to the biasing circuit 124. Accordingly, the selected or activated amplifiers 102, 104, and/or 106 may each amplify the received signal based on receiving the biasing voltage.

At block 238, the processor 12 causes the subthreshold biasing circuit to provide a nonzero subthreshold bias voltage below the bias voltage threshold to one or more remaining (e.g., non-selected) amplifiers of the VGA 100 to deactivate the remaining amplifiers. For example, the processor 12 may close the switches 126, 128, and/or 130 at the second state of the remaining amplifiers 102, 104, and/or 106. As such, the processor 12 may couple the second amplifier inputs 122-1, 122-2, and/or 122-3 of the remaining amplifiers 102, 104, and/or 106 to the subthreshold biasing circuit 132 to deactivate the remaining amplifiers 102, 104, and/or 106. Accordingly, the one or more deactivated amplifiers of the VGA 100 may provide the distortion cancelling signal to reduce an amplitude of (or cancel) the distortion signals of the amplified signals (e.g., or the combined amplified signal of the VGA 100).

At block 240, the processor 12 causes the VGA 100 to output a combination of output signals of the amplifiers 102, 104, and/or 106. Accordingly, the VGA 100 may combine the amplified signals and the distortion signals of the activated and deactivated amplifiers 102, 104, and/or 106 to provide the VGA output signal with reduced distortion. As mentioned above, the distortion cancelling signals may reduce or cancel the distortion signals of the activated amplifiers 102, 104, and/or 106. As such, an amplitude (e.g., electrical power) of the distortion signal of the VGA output signal may be reduced based on providing the nonzero subthreshold bias voltage to the deactivated amplifiers 102, 104, and/or 106 of the VGA 100. The processor 12 may determine or retrieve the nonzero subthreshold bias voltage and/or the configuration of the deactivated amplifiers 102, 104, and/or 106 of the VGA 100 receiving the nonzero subthreshold bias voltage from the lookup table stored in the memory 14, nonvolatile storage 16, or any other viable storage of the electronic device 10.

Figure 9:
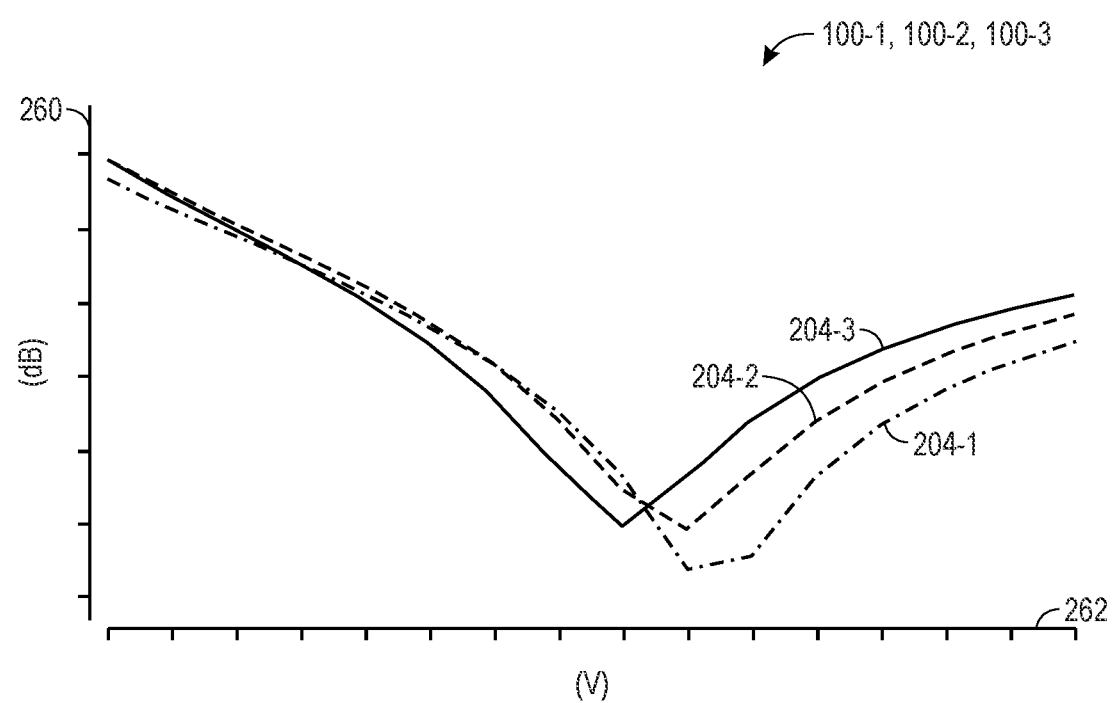
FIG. 9 is a graph illustrating reduction of electrical power of distortion signals of the variable gain amplifier of FIG. 5 based on providing different nonzero subthreshold bias voltages to non-selected amplifiers, according to embodiments of the present disclosure.

FIG. 9 depicts a graph of electrical powers 260 (e.g., in dB) of compensated distortion signals 204-1, 204-2, and 204-3 provided by different VGAs 100-1, 100-2, and 100-3 of FIG. 5. The VGAs 100-1, 100-2, and 100-3 may correspond to VGAs 100 having similar schematics with different component properties and/or manufacturing process variations. In particular, amplifiers 102, 104, and 106 of each of the different VGAs 100 may receive the bias voltage ($V_T$) to become activated. Moreover, remaining amplifiers 102, 104, and 106 of each of the different VGAs 100 may receive a range of nonzero subthreshold bias voltages ($V_{ST}$) 262 to compensate for distortion signals 202 of the different VGAs 100-1, 100-2, and 100-3 of FIG. 5.

As mentioned above, the subthreshold biasing circuit 132 may provide the range of nonzero subthreshold bias voltages ($V_{ST}$) 262 (e.g., including the one or more nonzero subthreshold bias voltages ($V_{ST}$)). In some cases, the processor 12 may provide one or more control signals to provide the range of nonzero subthreshold bias voltages ($V_{ST}$) 262 based on controlling the current source 184 and/or the switches 182 of the subthreshold biasing circuit 132. That is, the processor 12 may adjust the current source 184 and/or the switches 182 to provide different nonzero subthreshold bias voltages ($V_{ST}$) 262, which may, in turn result in varying the amount of compensation of the distortion signals 202. The processor 12 may provide one or more control signals to provide the range of nonzero subthreshold bias voltages ($V_{ST}$) 262 in calibration mode, during a start-up sequence of an electronic device 10 including the VGA 100, during manufacturing, and so on.

In any case, the processor 12, or any other viable processing circuit internal or external to the electronic device 10, may select a nonzero subthreshold bias voltages ($V_{ST}$) (e.g., 7 mV, 8 mV, 9 mV, 10 mV, 7 μV, 8 μV, 9 μV, 10 μV, and so on) of the range of nonzero subthreshold bias voltages ($V_{ST}$) 262. For example, the processor 12 may provide the selected nonzero subthreshold bias voltages ($V_{ST}$) to cause higher compensation of the distortion signals 202. For example, the processor 12 may provide the selected nonzero subthreshold bias voltages ($V_{ST}$) such that the VGAs 100-1, 100-2, and 100-3 may provide the compensated distortion signals 204-1, 204-2, and 204-3, respectively, with the lowest electrical power (e.g., −65 dB, −70 dB, −75 dB, −80 dB, −85 dB, −90 dB, −95 dB, and so on).

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A variable gain amplifier circuit, comprising:
an input terminal;
an output terminal;
a biasing circuit configured to provide a bias voltage equal to or above a bias voltage threshold;
a subthreshold biasing circuit configured to provide a subthreshold nonzero bias voltage below the bias voltage threshold;
a first amplifier having a first input coupled to the input terminal, a second input configured to couple to the biasing circuit, and a first output coupled to the output terminal; and
a second amplifier having a third input coupled to the input terminal, a fourth input different from the third input configured to couple to the subthreshold biasing circuit to receive the subthreshold nonzero bias voltage, and a second output coupled to the output terminal, the second amplifier configured to generate a first distortion cancelling signal based on the subthreshold nonzero bias voltage.

2. The variable gain amplifier circuit of claim 1, wherein the first amplifier is configured to amplify an input signal of the first input to provide an amplified signal via the first output when the biasing circuit is coupled to the second input.

3. The variable gain amplifier circuit of claim 2, wherein the amplified signal comprises one or more distortion signals, wherein the second amplifier is configured to provide the first distortion cancelling signal via the second output to reduce an amplitude of at least one of the one or more distortion signals when the subthreshold biasing circuit is coupled to the fourth input.

4. The variable gain amplifier circuit of claim 1, comprising a third amplifier having a fifth input coupled to the input terminal, a sixth input configured to couple to the subthreshold biasing circuit, and a third output coupled to the output terminal.

5. The variable gain amplifier circuit of claim 4, wherein the first amplifier is configured to amplify an input signal of the first input to provide an amplified signal via the first output when the second input is coupled to the biasing circuit, the amplified signal comprising one or more distorted signals, wherein the second amplifier is configured to provide the first distortion cancelling signal via the second output to reduce an amplitude of at least one of the one or more distortion signals when the fourth input is coupled to the subthreshold biasing circuit, and the third amplifier is configured to provide a second distortion cancelling signal via the third output to reduce an amplitude of at least one of the one or more distortion signals when the sixth input is coupled to the subthreshold biasing circuit.

6. The variable gain amplifier circuit of claim 1, comprising a switch configured to couple the fourth input to the biasing circuit in a first state and to the subthreshold biasing circuit in a second state.

7. The variable gain amplifier circuit of claim 6, wherein the switch is configured to couple the fourth input to ground in a third state.

8. The variable gain amplifier circuit of claim 1, wherein the subthreshold biasing circuit comprises a plurality of transistors configured to couple to a current source, wherein the subthreshold biasing circuit is configured to provide the subthreshold nonzero bias voltage based on coupling one or more transistors of the plurality of the transistors to the current source.

9. The variable gain amplifier circuit of claim 8, wherein the current source is coupled to the biasing circuit to receive a feedback current, wherein the current source is configured to provide an electrical current to the one or more transistors of the plurality of the transistors based on receiving the feedback current.

10. An electronic device comprising:
one or more antennas, and
a variable gain amplifier coupled to the one or more antennas having:
a first amplifier having a first input configured to receive a bias voltage equal to or greater than a bias voltage threshold to provide an amplified signal with one or more distortion signals based on an input signal, and
a second amplifier having a second input and a third input, the second input configured to receive the input signal while the third input is configured to receive a subthreshold nonzero bias voltage below the bias voltage threshold to provide a first distortion cancelling signal.

11. The electronic device of claim 10, wherein the variable gain amplifier comprises a switch configured to couple the first input to a biasing circuit in a first state to receive the bias voltage and to a subthreshold biasing circuit in a second state to receive the subthreshold nonzero bias voltage.

12. The electronic device of claim 11, comprising a processor configured to provide one or more control signals indicative of the first state or the second state to the switch, wherein the switch couples the third input to the biasing circuit when the one or more control signals indicate the first state and couples the third input to the subthreshold biasing circuit when the one or more control signals indicate the second state.

13. The electronic device of claim 10, wherein the first amplifier is configured to provide the amplified signal with the one or more distortion signals when coupled to a biasing circuit and the second amplifier is configured to provide the first distortion cancelling signal when coupled to a subthreshold biasing circuit to reduce an amplitude of at least one of the one or more distortion signals of the amplified signal.

14. The electronic device of claim 10, comprising a third amplifier having a fourth input configured to receive the subthreshold nonzero bias voltage to provide a second distortion cancelling signal, wherein the first distortion cancelling signal and the second distortion cancelling signal may reduce an amplitude of at least one of the one or more distortion signals of the amplified signal.

15. The electronic device of claim 14, wherein the first input is configured to couple to a biasing circuit to provide the amplified signal and the one or more distortion signals, the third input is configured to couple to a subthreshold biasing circuit to provide the first distortion cancelling signal to reduce the amplitude of at least one of the one or more distortion signals, and the third amplifier is configured to couple to the subthreshold biasing circuit to provide the second distortion cancelling signal to reduce an amplitude of at least one of the one or more distortion signals.

16. A method comprising:
receiving, by a processor communicatively coupled to a variable gain amplifier circuit, an indication to amplify a signal with a gain,
determining, by the processor, one or more amplifiers of the variable gain amplifier circuit to provide the signal with the gain,
causing, by the processor, a biasing circuit to provide a bias voltage greater than or equal to a bias voltage threshold to the one or more amplifiers to amplify the signal with the gain,
causing, by the processor, a subthreshold biasing circuit to provide a subthreshold nonzero bias voltage less than the bias voltage threshold to a supply voltage input of one or more remaining amplifiers of the variable gain amplifier circuit while a signal input of the one or more remaining amplifiers different from the supply voltage input receives the signal, the one or more remaining amplifiers configured to generate a distortion cancelling signal to cancel at least a portion of distortions in the signal as amplified based on the subthreshold nonzero bias voltage,
causing, by the processor, the variable gain amplifier circuit to output a combination of the signal and the distortion cancelling signal.

17. The method of claim 16, comprising referencing, by the processor, a lookup table to determine the one or more amplifiers of the variable gain amplifier circuit based on receiving the indication to amplify the signal with the gain.

18. The method of claim 16, comprising referencing, by the processor, a lookup table to determine the one or more remaining amplifiers of the variable gain amplifier circuit based on receiving the indication to amplify the signal with the gain and the determining the one or more amplifiers to amplify the signal with the gain.

19. The method of claim 16, wherein causing, by the processor, the biasing circuit to provide the bias voltage to the one or more amplifiers comprises providing one or more control signals to couple the supply voltage input of the one or more amplifiers to the biasing circuit.

20. The method of claim 16, wherein causing, by the processor, the subthreshold biasing circuit to provide the subthreshold nonzero bias voltage to the one or more remaining amplifiers comprises providing one or more control signals to couple the supply voltage input of the one or more remaining amplifiers to the subthreshold biasing circuit.

* * * * *